Figure 1:
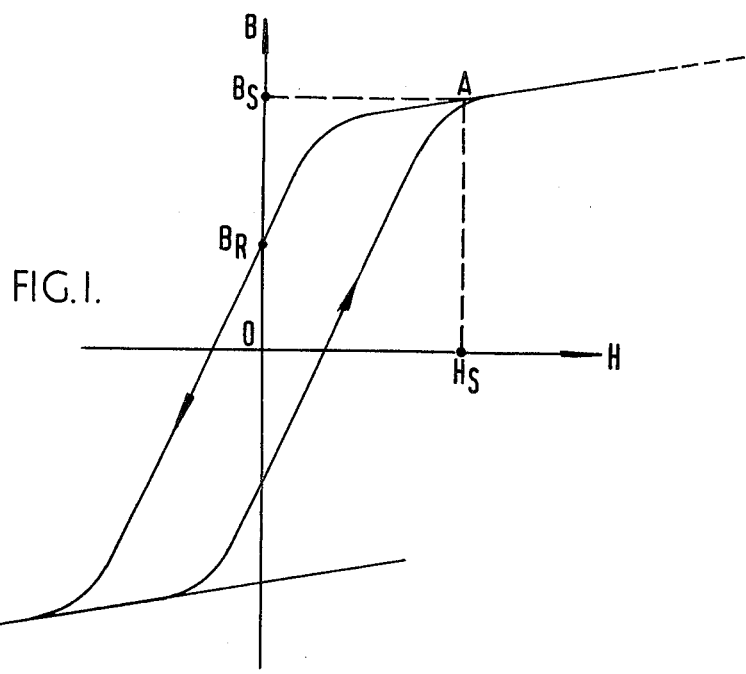

United States Patent [19]  [11] 4,353,113
Billings  [45] Oct. 5, 1982

[54] SWITCH MODE CONVERTERS

[75] Inventor: Keith H. Billings, Ilfracombe, England

[73] Assignee: Electrotech Instruments Limited, Devon, England

[21] Appl. No.: 245,660

[22] Filed: Mar. 20, 1981

[30] Foreign Application Priority Data

Mar. 21, 1980 [GB] United Kingdom ............... 8009706

[51] Int. Cl.³ .......................................... H02M 3/335
[52] U.S. Cl. .................................... 363/21; 323/249; 363/41; 363/93; 363/97
[58] Field of Search ................. 323/249, 250; 363/91, 363/93, 20, 21, 41, 97

[56] References Cited

U.S. PATENT DOCUMENTS

| 4,020,408 | 4/1977 | Grant | 363/21 |
| 4,031,452 | 6/1977 | Longa et al. | 363/91 |
| 4,056,411 | 11/1977 | Chen et al. | |
| 4,155,397 | 5/1979 | Honsinger et al. | |
| 4,188,211 | 2/1980 | Yamaguchi et al. | |
| 4,211,957 | 7/1980 | Alley et al. | |

Primary Examiner—William M. Shoop
Attorney, Agent, or Firm—Wigman & Cohen

[57] ABSTRACT

A magnetic amplifier which has a main winding and at least one secondary reset winding, and a core composed of amorphous magnetic material, the amplifier being arranged to operate at a frequency greater than 20 KHz. The invention also includes a switch mode converter which includes such a magnetic amplifier arranged to regulate the output of the converter by pulse width modulation.

8 Claims, 3 Drawing Figures

SWITCH MODE CONVERTERS

This invention relates to magnetic amplifiers (sometimes also referred to as saturable reactors) and it is an object of the present invention to provide an improved magnetic amplifier.

The present invention consists in a magnetic amplifier which has a main winding and at least one secondary reset winding, and a core composed of amorphous magnetic material, the amplifier being arranged to operate at a frequency greater than 20 KHz.

The invention is also concerned with electrical circuits incorporating a magnetic amplifier as set forth in the preceding paragraph, and one form of electrical circuit in which the magnetic amplifier may be used with advantage is a switch mode converter of the type in which a d.c. supply to the primary of a high frequency transformer is switched on and off, for example by semi-conductor switches. Conventionally such converters are arranged to operate at a frequency which is typically 15-25 KHz. Usually the d.c. supply is derived by rectifying and filtering an a.c. mains input. The transformer is provided with one or more secondary winding circuits in which the output is rectified and integrated to provide a nearly smooth d.c. at output terminals.

A closed loop control circuit may be provided between the primary circuit and the secondary circuit or a first one of the secondary circuits if more than one, to control the duration of the on time of the switches in the primary circuit so as to maintain constant the output voltage of the secondary circuit. When more than one secondary circuit is provided the regulation will extend to the other secondary circuits in addition to the first, although these may suffer individual output voltage variations arising from differences between their conditions and the conditions of the first secondary circuit. In this event, additional regulation may be provided in each of the additional secondary circuits.

It is a further object of the present invention to provide an improved switch mode converter in which voltage regulation is provided in the or each individual secondary circuit whilst maintaining high efficiency in the secondary circuit or circuits and enabling a relatively compact converter to be constructed.

The present invention further consists in a switch mode converter which includes a high frequency transformer having a primary winding in a primary circuit arranged to be energized by direct current and having means for switching the direct current at a frequency greater than 20 KHz, and at least one secondary winding included in a secondary winding circuit having means for smoothing and integrating the output of the secondary winding to provide a relatively smooth d.c. voltage and current at output terminals, wherein the primary or secondary circuit includes a magnetic amplifier having a core of amorphous magnetic material arranged to operate at a frequency greater than 20 KHz and to regulate the output of the secondary circuit by pulse width modulation of the flow of current to the smoothing and integrating means.

Figure 2:
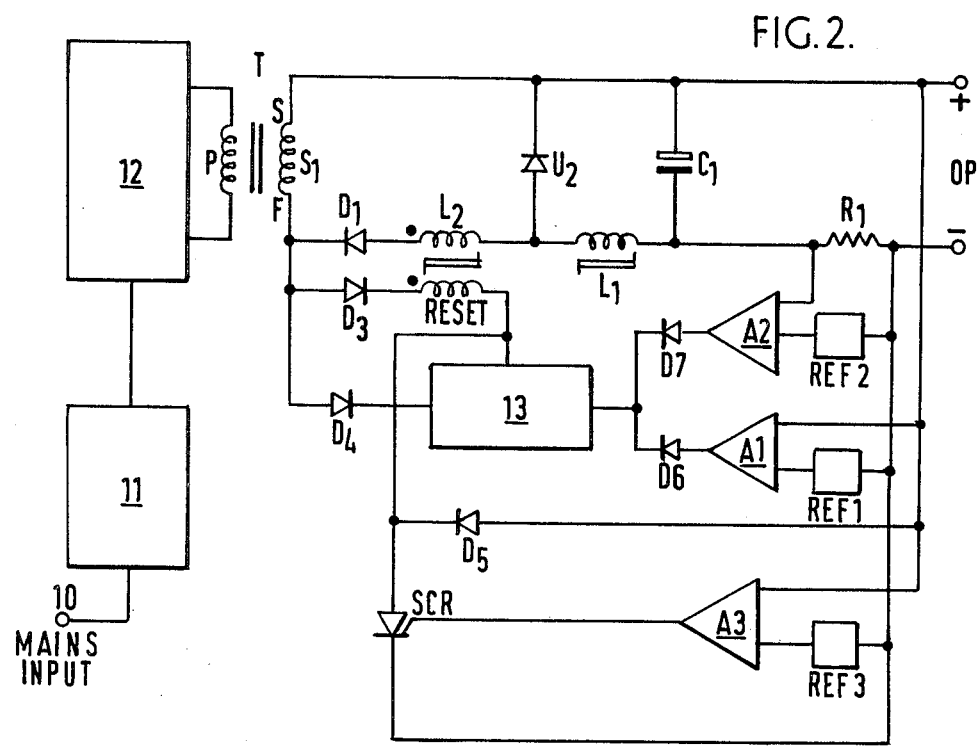
Figure 3:
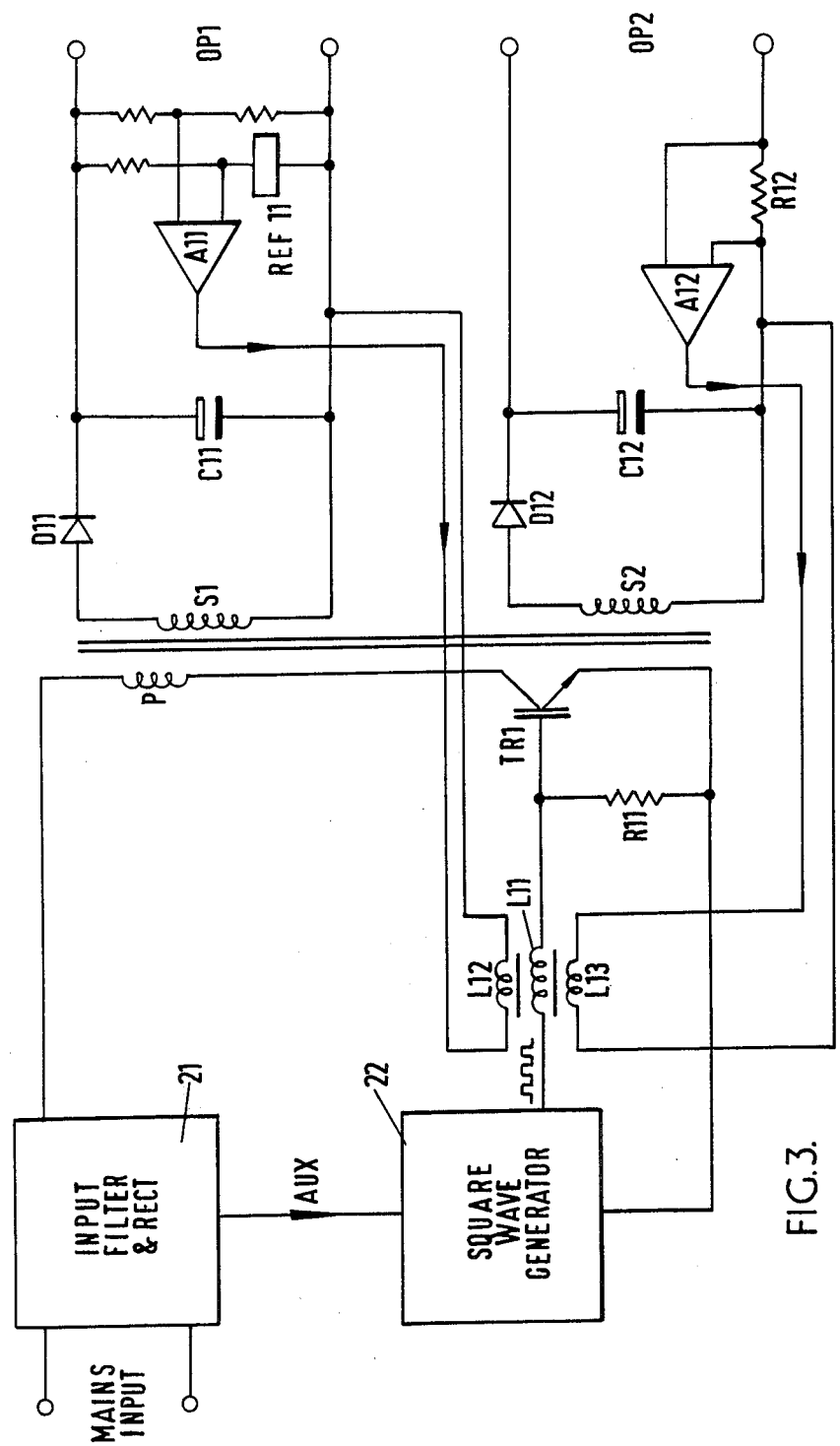

In the accompanying drawings:

FIG. 1 shows a magnetization curve to assist in the explanation of the invention, FIG. 2 shows one form of electrical circuit according to the present invention, and FIG. 3 shows an alternative form of electrical circuit according to the present invention.

In carrying the invention into effect according to one convenient mode by way of example, a magnetic amplifier (saturable reactor) intended to operate at a frequency greater than 20 KHz has a main winding and one or more secondary reset windings and a core composed of amorphous magnetic material. Such material has an extremely square loop magnetic characteristic, high remanence ratio and low coercivity, and is usually manufactured by the special treatment of alloys of ferrous metals such as iron, nickel and cobalt.

FIG. 1 shows diagrammatically the magnetization curve of the core (from which the initial magnetization curve has been omitted for clarity). When the voltage applied to the main winding is reduced to zero (and assuming no voltages across the reset windings), the induced flux B in the core will have its remanence value $B_R$. Point A on the curve represents the notional saturation point at which the magnetising force H has a value Hs and induces notional saturation flux $B_S$.

If there is an increase in current causing the magnetising force to exceed $H_s$, then the core will be driven into a post-saturation region beyond point A and there will be a small increase (usually disregarded) in the magnetic flux above the notional saturation value $B_s$. The gradient at any point on this path, i.e. $\Delta B/\Delta H$ represents the permeability of the material at that point, and the magnetic characteristic represented by the gradient of the path to the right of point A as shown may conveniently be referred to as post-saturation permeability.

In a preferred form of the invention, the amorphous magnetic material should be chosen so as to have the following characteristics, all measured at a frequency of 35 KHz:

(i) the time taken for the core to saturate should be as small as possible and since this time is dependent upon the difference between the magnetic flux at notional saturation, i.e. $B_s$, and the magnetic flux at zero magnetic field strength, i.e. the remanence $B_R$, the ratio $B_R/B_S$ should be as close to 1 as possible, at least greater than 0.7 and preferably greater than 0.9;

(ii) the impedance of the main winding of the magnetic amplifier when the core is saturated should be as small as possible so that beyond the point A at high values of the magnetic field strength, the ratio of the induced magnetic flux to the remanence $B_R$ should not be much less than the ratio $B_R/B_S$ above, and this is best defined by reference to the post saturation permeability $\Delta B/\Delta H$ which should be less than 1000 and preferably less than 700 at a magnetic field strength of $H=1$ ampere turn per cm., where the flux B is measured in Tesla;

(iii) for minimum magnetization current the pre-saturation inductance of the main winding of the magnetic amplifier should be as high as possible so that the permeability $\Delta B/\Delta H$ at magnetic flux $B=0$ should be as high as possible, at least greater than 50,000 and preferably greater than 100,000 or even 500,000 using units of Tesla and ampere turns per cm; and (iv) the coercivity of the core should be low so that the high frequency power losses of the core are kept to less than 100 watts per Kg of core material for a magnetization cycle having a maximum magnetic flux $B=0.4$ Tesla.

FIG. 2 shows a switch mode converter in which an a.c. mains input at 10 is fed to a rectifier and filter circuit 11 which supplies a high voltage direct current (say 310 volts when using 240 v a.c. mains) to a switching circuit 12 arranged to operate at a frequency which is typically 50 or 75 KH$_z$ (but could be as low as 20 or 25 KH$_z$ or as high as 200 KH$_z$) and connected in a primary circuit which includes the primary winding P of a transformer T suitable for operation at this high frequency. The circuit is arranged to operate on an equal mark-space ratio.

The transformer T has a secondary winding S1 in a secondary circuit which includes diodes D1 and D2, inductor L1 and capacitor C1 arranged to rectify and integrate the square wave output from secondary winding S1 to provide a relatively smooth direct current output OP at the output terminals. Energy is transformed from the primary circuit to the secondary circuit during the on state of the switching circuit 12.

The diode D1 is connected in series with the main winding L2 of a magnetic amplifier arranged to apply voltage regulation to the d.c. output by means of pulse width modulation in the following manner.

The magnetic amplifier has a core composed of amorphous magnetic material as previously described with reference to FIG. 1.

Starting from the point when the finish F of the secondary winding S1 changes from positive to negative, diode D1 will change to conduction to apply the full secondary winding voltage to the main winding L2 of the magnetic amplifier. If the reset winding of the amplifier has not been energized, the amplifier will be operating close to its saturated condition so that very shortly after the application of the voltage to the winding L2 its core will be saturated and a large current will flow into the integrating circuit L1 and C1. This provides for a maximum pulse width and hence maximum output voltage. During the short delay when the core is saturating, only a small current will flow into inductor L1, this being the magnetising current of the core.

However, if during the off period of D1 the reset winding of the amplifier has previously been energized by current flowing through diode D3, then the core will have been reset away from near its positive saturated value towards its negative saturated value. As a result, the flow of current into integrating circuit L1 and C1 will be delayed to an extent depending upon the degree of resetting of the core thereby reducing the pulse width.

If the core has been completely reset during the off period of D1 then when D1 is brought into conduction the voltage time product will not be long enough to bring the core of the amplifier into saturation and the current flowing into circuit L1 and C1 will be a small value determined by the inductance of the winding L2 i.e. the magnetising current only.

The output voltage and current of the converter may thus be controlled by the magnetic amplifier exerting pulse width control upon the flow of current to circuit L1 and C1.

In the circuit shown in the drawing, the reset winding is controlled by a control circuit 13 energized by diode D4 connected to the secondary winding S1. Voltage regulation is achieved by means of amplifier A1 connected to the d.c. output and to a reference voltage REF 1 so that when the d.c. output voltage reaches the required level, amplifier A1 will operate via diode D6 on circuit 13 to cause the core of the magnetic amplifier to be driven in the direction of negative saturation, when point F is positive, by an amount necessary to maintain the d.c. output voltage constant.

Current limiting action is provided by a further amplifier A2 connected to a resistor R1 in series in the d.c. output and a reference voltage REF2. When the output current exceeds a predetermined maximum as detected by the voltage across resistor R1, amplifier A2 will act via gating diode D7 to cause circuit 13 to control the current through the reset winding to prevent the output current from increasing further.

Over voltage protection is provided by an amplifier A3 connected to a reference voltage REF3 and monitoring the d.c. output voltage. In the event of an overvoltage condition, amplifier A3 conducts to operate SCR which has two actions. Firstly maximum current flows through the reset winding of the magnetic amplifier to reduce the output current to a minimum and secondly diode D5 is caused to conduct so as to discharge the output capacitor C1 and thereby maintain the output voltage near zero. In the event of failure of all three systems, a fuse is arranged to clear on the input circuit. Operating voltages for amplifiers A1 to A3 and references REF1 and REF3 are derived via diode D4.

It should be noted that the entire secondary circuit including its controls is energized solely from the output of the secondary winding, without the need for separate auxiliary windings.

It will be appreciated that one or more similar additional secondary circuits may be associated with the same or additional secondary windings on the transformer.

FIG. 3 shows an alternative form of switch mode converter arranged to operate in the fly back mode and providing two outputs OP1 and OP2.

An a.c. mains input is fed to a filter and rectifier circuit 21 which supplies a high voltage direct current (say 310 volts) to a primary circuit which includes the primary winding P of a transformer T and a semi-conductor power switch TR1. Circuit 21 also provides auxiliary power supplies to a square wave generator 22 operating with an equal mark-space ratio and arranged to drive the switch TR1 at a frequency similar to that described with reference to the circuit of FIG. 2.

In operation, the power switch TR1 provides power pulses to the transformer T and energy will be transferred to the outputs OP1 and OP2 by flyback action via secondary windings S1 and S2 of transformer T, and rectifier and filter components D11 and C11 and D12 and C12 associated with the two secondary circuits respectively.

The main winding L11 of a magnetic amplifier is connected in series between the base of the power switch TR1 and the square wave generator 22. The magnetic amplifier has two reset windings L12 and 13 and has a core composed of amorphous magnetic material as described with reference to the circuit of FIG. 2.

When the core of the magnetic amplifier is saturated, the maximum pulse width available (i.e. 50%) will be applied to the power switch TR1 and the outputs OP1 and OP2 will be at maximum.

The reset windings L12 and 13 can be used to provide protection control by resetting the core away from saturation as previously described and thus controlling the pulse width operative to control the operation of the power switch TR1.

Many control functions may be applied, but in the example shown in FIG. 3 amplifier A11 is used to compare the voltage at output OP1 with a reference REF and to apply a control signal to reset winding L12 so as to limit the voltage at output OP1. Amplifier A12 is used to sample the output current flowing through resistor R11 and to apply a control signal to reset winding L12 so as to limit the current at output OP2. It will be appreciated that if the circuit operates to limit the voltage or current at one output, then the other output will also be affected.

Similar action, but in a shunt mode, may be obtained by interchanging the main winding L11 of the magnetic amplifier and the resistor R11.

I claim:

1. A magnetic amplifier having a main winding and at least one secondary reset winding, and a core composed of amorphous magnetic material, the amplifier being arranged to operate at a frequency greater than 20 KH$_z$, wherein the amorphous magnetic material has the following characteristics measured at a frequency of 35 KH$_z$:
   (i) a remanence ratio $B_R/B_S$ greater than 0.7, where $B_R$ is the remanence and $B_S$ the magnetic flux at notional saturation;
   (ii) a post-saturation permeability $\Delta B/\Delta H$ of less than 1000, when measured at a magnetic field strength of H=1 ampere turn per cm., where the flux B is measured in Tesla;
   (iii) a permeability $\Delta B/\Delta H$ of greater than 50,000 when measured at magnetic flux B=0, using units of Tesla and ampere turns per cm.; and
   (iv) a coercivity such that the high frequency power loses of the core are less than 100 watts per kg of core material measured at a maximum flux of 0.4 Tesla.

2. A magnetic amplifier as claimed in claim 1, wherein $B_R/B_S$ is greater than 0.9.

3. A magnetic amplifier as claimed in claim 1, where $\Delta B/\Delta H$ is less than 700 at H=1 ampere turns per cm.

4. A magnetic amplifier as claimed in claim 1, wherein $\Delta B/\Delta H$ is greater than 100,000 at B=0.

5. A magnetic amplifier as claimed in claim 1, wherein $\Delta B/\Delta H$ is greater than 500,000 at B=0.

6. A switch mode converter which includes a high frequency transformer having a primary winding in a primary circuit arranged to be energized by direct current and having means for switching the direct current at a frequency greater than 20 KH$_z$, and at least one secondary winding included in a secondary winding circuit having means for smoothing and integrating the output of the secondary winding to provide a relatively smooth d.c. voltage and current at output terminals, wherein the primary circuit includes a magnetic amplifier arranged to regulate the output of the secondary circuit by pulse width modulation of the current in the primary circuit.

7. A switch mode converter which includes a high frequency transformer having a primary winding in a primary circuit arranged to be energized by direct current and having means for switching the direct current at a frequency greater than 20 KH$_z$, and at least one secondary winding included in a secondary winding circuit having means for smoothing and integrating the output of the secondary winding to provide a relatively smooth d.c. voltage and current at output terminals, wherein the secondary circuit includes a magnetic amplifier arranged to regulate the output of the secondary circuit by pulse width modulation of the output of the secondary winding.

8. A switch mode converter as claimed in claims 6 or 7, wherein under normal operating conditions the converter is arranged to operate at maximum pulse width with saturation of the core of the magnetic amplifier during each "on" period.

* * * * *